United States Patent [19]

Emamjomeh et al.

[11] Patent Number: 4,778,564
[45] Date of Patent: Oct. 18, 1988

[54] PROCESS FOR PRODUCING AN ASSEMBLY TAPE FOR BONDING METAL FINGERS TO ELECTRONIC DEVICES

[75] Inventors: Ali Emamjomeh, Sunnyvale; Richard Rice, Los Altos Hills, both of Calif.

[73] Assignee: National Semiconductor Corporation, Santa Clara, Calif.

[21] Appl. No.: 121,385

[22] Filed: Nov. 16, 1987

Related U.S. Application Data

[62] Division of Ser. No. 878,930, Jun. 26, 1986, Pat. No. 4,721,992.

[51] Int. Cl.$^4$ .............................. C23F 1/02; B44C 1/22
[52] U.S. Cl. ....................... 156/644; 29/827; 156/634; 156/645; 156/651; 156/656; 156/661.1; 156/901; 430/318
[58] Field of Search ............. 156/634, 644, 645, 651, 156/656, 659.1, 661.1, 901, 902; 357/70; 437/217; 29/827; 428/571–575, 596, 131, 137; 430/312, 318; 361/421

[56] References Cited

U.S. PATENT DOCUMENTS 3,611,061 10/1971 Segerson .................. 174/52 PE
3,768,986 10/1973 Ramos et al. ............. 174/52 PE
4,510,017 4/1985 Barber ..................... 151/651
4,681,654 7/1987 Clementi et al. .......... 156/630

Primary Examiner—William A. Powell
Attorney, Agent, or Firm—Gail W. Woodward

[57] ABSTRACT

In an assembly tape to be used in the tape automated bonding of semiconductor devices a single layer or two or three layer tape is described. The arrays of finger patterns created in the tape are isolated by forming transverse slots across the tape. These slots act to mechanically isolate adjacent finger patterns and improve tape flexibility. When the tape is passed under the guide shoe in an inner lead bonding machine the metal fingers will not be distorted as the tape flexes. After the semiconductor device is bonded to the tape the increased tape stiffness does not cause the tape to be deflected from its desired location with respect to the guide shoe. The slots desirably span the space between tape locator holes. If desired, the slots can be extended on the finger side of the tape to span the locator holes to form slot extension regions of reduced tape thickness. Alternatively, a slot can be formed from a plurality of shorter slots that in the aggregate perform the same function.

5 Claims, 2 Drawing Sheets

U.S. Patent    Oct. 18, 1988    Sheet 1 of 2    4,778,564
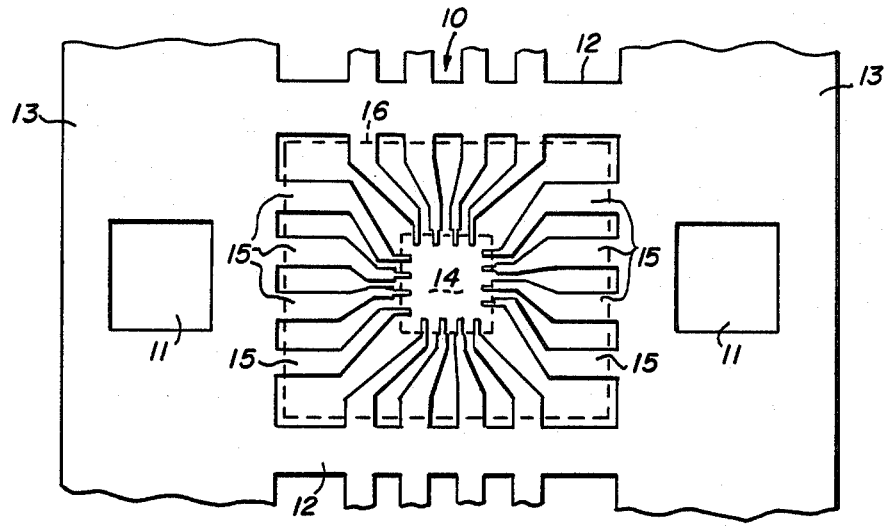
Fig_1 (PRIOR ART)
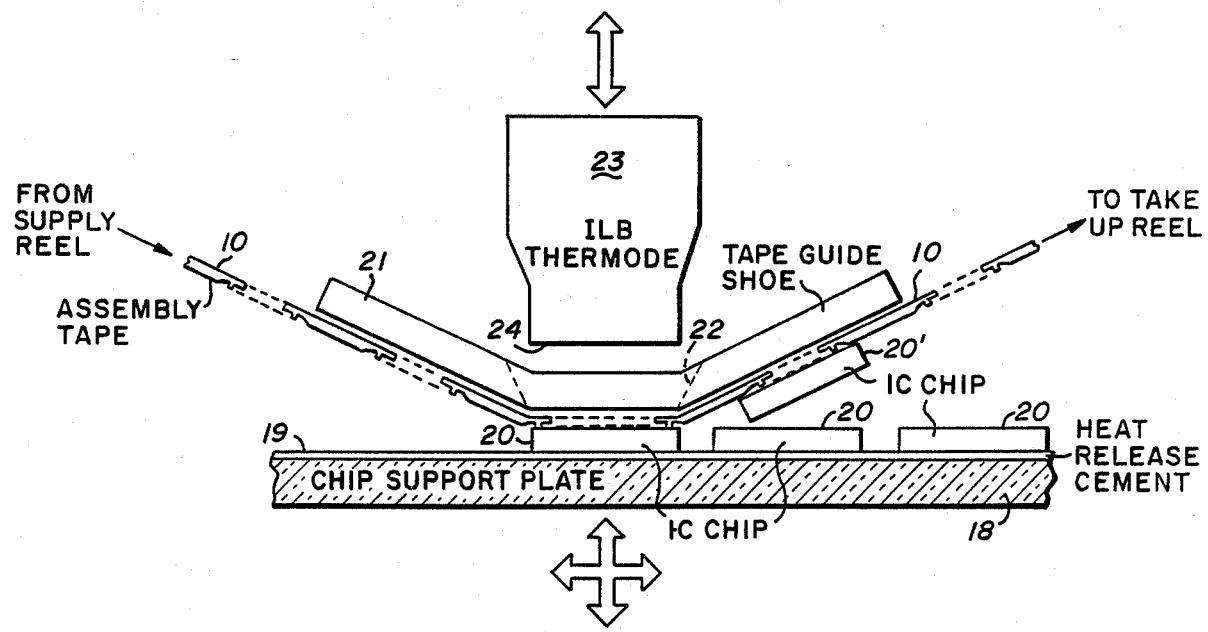
Fig_2 (PRIOR ART)

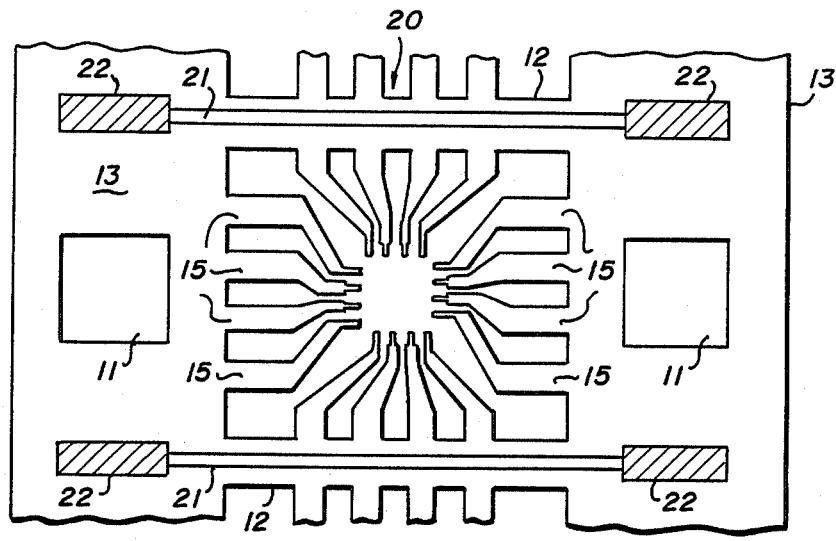
Fig_3
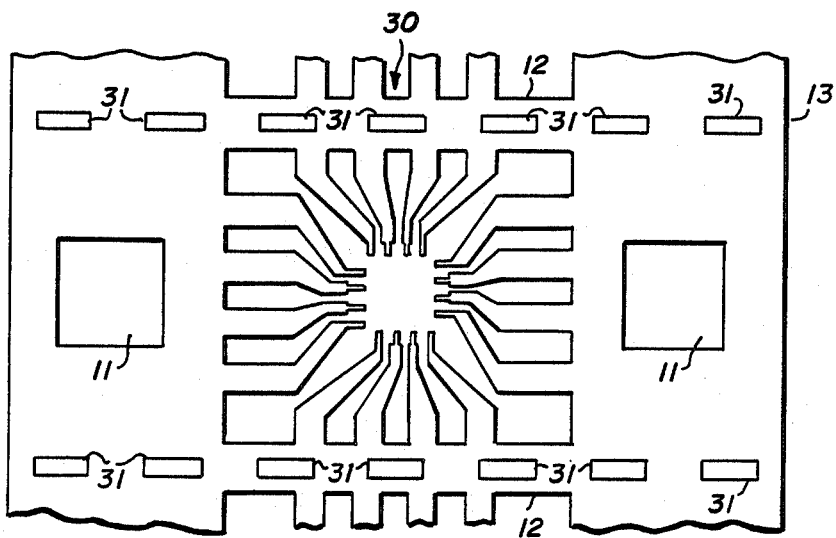
Fig_4

PROCESS FOR PRODUCING AN ASSEMBLY TAPE FOR BONDING METAL FINGERS TO ELECTRONIC DEVICES

This is a divisional of co-pending application Ser. No. 878,930 filed on Jun. 26, 1986, U.S. Pat. No. 4,721,992.

BACKGROUND OF THE INVENTION

The invention relates to Tape Automated Bonding (TAB) of semiconductor devices. Reference can be made to U.S. Pat. No. 4,234,666 for a basic teaching of TAB. In a copending patent application Ser. No. 138,030 filed Apr. 7, 1980, now abandoned in favor of continuation application Ser. No. 407,515 filed Aug. 12, 1982, and titled LEAD DESIGN FOR SEMICONDUCTOR AUTOMATIC ASSEMBLY, by Carmen D. Burns, a bonding tape is disclosed having integral strain relief elements useful in thermocompression (TC) bonding. The teachings in the above references are incorporated herein by reference.

Basically, in the single layer tape version of TAB a metal tape is provided with at least one row (and preferably two rows) of indexing and transport locater holes. A series of personality windows is formed in the tape in registry with the locater holes. Each personality window is provided with a metal finger pattern that extends from the edge of the personality window inwardly to a central array that is designed to mate with the bonding pad pattern on a particular semiconductor device, such as an IC chip or other electronic element. The tape is passed through an automated machine which bonds the tape fingers to an IC chip which then becomes attached to the tape, preferably by means of TC gang bonding.

The IC chip with the attached metal fingers can be subsequently excised from the tape and bonded to a secondary structure for further packaging such as mounting directly upon a printed wiring board or encapsulation in a dual in-line package (DIP) or other housing. This latter approach usually involves mounting a chip frame attached fingers upon a more substantial lead frame which employs a lead array that can ultimately be plugged into a DIP socket or mounted in suitable holes in a printed wiring board.

As pointed out above, the assembly tape is first run through an automatic machine which bonds an IC chip to each of the tape finger arrays. This is referred to as inner lead bond (ILB) formation. In this operation a thermode presses the inner ends of the metal tape fingers to the bonding pads on the chip so as to TC gang bond the tape fingers. In this operation, the tape is passed under a tape guide shoe which holds the tape in a controlled spatial location. This shoe is shaped so that the tape flexes as it passes through the machine. Such flexing can act to displace elements in the tape finger arrays and can act to cause a bonded chip to be deflected from its intended path. The bonded chip can, if deflected, come into contact with other yet to be bonded chips located in the machine and fracturing can occur. In fully automated equipment image processing is employed to evaluate the finger pattern and to align it with the semiconductor device bonding pads. If a lead is bent its optical reflection can be altered so that the image processing is incorrect. It has been found that the automated equipment can confuse a bent lead with a missing finger and thereby reject the assembly tape.

SUMMARY OF THE INVENTION

It is an object of the invention to substantially increase the flexibility of an assembly tape.

It is a further object of the invention to isolate sequential finger patters in an assembly tape so that tape flexure will not result in deformation of adjacent finger patterns.

It is a still further object of the invention to mechanically isolate adjacent finger patterns in an assembly tape so as to increase tape flexibility which will permit the tape to conform to the shape of a guide shoe.

These and other objects are achieved in an assembly tape. The tape is provided with at least one row, and preferably two rows, of locater holes that extend along the tape edges. The successive finger patterns are separated by narrow transverse sections called dam bars. The dam bars form the lateral boundaries of personality windows into which the finger patterns extend. The longitudinal boundaries are created by side rails which extend along the tape and which contain the locator holes. A drive sprocket includes teeth which extend into the locator holes to index and transport the tape. The inner ends of the tape fingers are TC gang bonded to the mating bonding pads of an IC chip in an ILB operation wherein the tape is passed under a guide shoe. The tape is made flexible by the incorporation of hinges into its structure. A slot is formed to traverse the dam bars so that adjacent finger patterns are mechanically isolated from each other. In the preferred embodiment, the slots extend to terminate at a line that lies along the inner portions of the locator holes. As a further part of the preferred embodiment the hinge action is extended beyond the slots in the form of a reduced thickness section that extends across that portion of the tape to the outer edges of the locator holes. This leaves a full thickness section of tape extending from the outer edge of the locator holes to the edge of the tape. This reduced thickness rail portion imparts substantial strength to the tape and resists shearing motion of the side rails. This relieves compressive stresses nn the tape as it is flexed under guide shoe. As a result, the tape will closely conform to the shape of the guide shoe as it is indexed through the ILB machine. The presence of the slot ensures that the tape fingers will not be deflected as the tape is flexed. The overall tape flexibility ensures that after chip bonding the bonded chip will not touch other unbonded chips in the ILB machine.

BRIEF DESCRIPTION OF THE DRAWING

FIG. 1 is a face view of a segment of tape showing a prior art form of bonding tape.

FIG. 2 is a simplified showing of a portion of an ILB machine.

FIG. 3 is a face view of a segment of hinge tape having a flexure enhancing slot.

FIG. 4 is a face view of a segment of hinge tape showing an alternative form of construction.

DESCRIPTION OF THE PRIOR ART

In FIG. 1 segment 10 represents a portion of an assembly tape of the kind employed in the prior art. Locator holes 11 form rows of holes extending along both edges of the tape. These holes are indexed with respect to the finger patterns. One finger pattern is shown extending into what is called a personality window which is formed by the laterally extending dam bars 12 and the tape side rails 13. An IC chip 14, which is shown in dashed outline, will have its bonding pads bonded to the inner extensions of the fingers 15 which extend in cantilever fashion into the personality window. First, chip 14 is attached to the tape using an ILB operation. Then the chip and the attached leads are excised from the tape at dashed line 16. The outer extensions of the bonded fingers can then be attached to a secondary structure to further the chip packaging. One well known method includes bonding the metal fingers to metal traces on a printed wiring substrate. Then the chip and the immediately adjoined portions of the board are covered with a blob of plastic compound. Another well known approach is to bond the metal fingers to a larger more substantial lead frame. A plastic molding compound is then formed around the lead frame to create the well known plastic DIP. The leads in the larger lead frame form pin elements that protrude from the molded plastic to provide for suitable connections.

FIG. 2 is a simplified drawing showing the elements of an ILB machine. In this machine, a processed silicon wafer is mounted upon a support plate 18, which is typically glass or ceramic, by means of a heat releasable cement 19. While the wafer is attached to the support plate, it is diced into chips by means of a saw. This leaves an array of IC chips 20 cemented to plate 18. The ILB machine has provisions (not shown) for raising and lowering plate 18 and for indexing it in the X, Y and directions. The machine has a tape guide shoe 21 which inludes a locating channel that will accommodate tape 10. A hole 22 in the central portion of shoe 21 is located to accommodate thermode 23 which has a bonding surface 24 designed to span the inner ends of the finger pattern in tape 10. Typically, tape guide shoe 21 has approach and exit reaches that form an angle of about 30° with respect to the horizontally arrayed central bonding position. The machine also has tape transport indexing take up reel, and supply reel mechanisms not shown. In operation the machine advances the tape so that a finger pattern is precisely located under hole 22. Then an IC chip mounted on plate 18 is indexed into position with respect to the tape fingers and plate 18 raised to the bonding position just below tape guide shoe 21. Then heated thermode 23 is lowered and pressed against the tape with sufficient pressure and heat to gang bond the metal fingers to the chip bonding pads. Since the thermode is heated for TC bonding, the chip will be heated so as to release the chip from the element 19 on plate 18. Then the thermode 27 is raised and plate 18 lowered so that the tape can be advanced to bring a new finger pattern into position and a new tape site can be indexed into position. If desired, an optical monitor (not shown) can be incorporated into the machine to observe the indexing process. Further, if desired, automatic optical posioning of tape 10 relative to plate 18 can be added.

It can be seen in FIG. 2 that as tape 10 is passed through the ILB machine it must be flexed as it traverses tape guide shoe 21. As the tape enters the bonding position from the left the tape fingers will tend to be bent downward towards plate 18. In terms of the FIG. 1 showing, this action will tend to distort the fingers attached to dam bars 12 more than those attached to side rails 13. This condition can be eased by making the dam bars very wide. However, this wastes valuable tape area that can better be used to increase the density of finger patterns. In other words, it is desirable to make dam bars 12 as narrow as possible.

Another condition exists at the tape exit from the bonding region. Once the tape fingers have been bonded to an IC chip the chip becomes a part of the tape. This means that after bonding the chips will stiffen the tape. Thus, the tape product that exits the bond region will be considerably stiffer than that which enters. This results in the tape that exits the bond region having a tendency to fail to conform to the tape guide shoe. This causes the tape to form a loop to the right of the bonding location and the just-attached chip 20' will be spaced downward from its desired location. It can be seen that the thus displaced chip could come into contact with other chips on support plate 18. This could damage either the bonded or the mounted chips (or both) and it is important that this condition be avoided. The tape flexibility afforded by the invention solves both of the above-recited problems.

It is to be understood that the preferred embodiment of the invention relates to so-called bumped tape where the metal fingers in the tape patterns have bumps at their ends where they are to be bonded to the IC pads. The invention is also useful in the older tape assembly systems in which flat metal fingers are bonded to metal bumps that are formed on the IC bonding pads. Also, while the single layer metal tape form of construction is preferred, the invention can be employed on two or three layer assembly tapes.

The tape of FIG. 1 is typically fabricated using a two-sided photolithographic metal etching process. First, both faces of the metal are covered with a photoresist. Then masks are employed to expose the two faces to different light patterns. The side shown in FIG. 1 is representative of the finger pattern. Typically, the locater holes 11 are created at the same time the fingers are created so that the exposure masks automatically provides indexed locater holes. The opposite side of the tape is exposed in a light pattern that leaves resist over the tips of the fingers but no resist over an adjacent portion of the fingers. The tape is then etched on both sides in a step that will etch the tape slightly over half way through. Etching both faces will completely remove the metal. This etching results in a thinning of the fingers in the region adjacent to the tip so that a raised or bump portion is create at the finger tip. This bump permits the tape fingers to be TC bonded to ordinary IC chip bonding pads. During TC bonding the finger bumps will collapse so that any unevenness in the tape or the bonding pads will be accommodated and a reliable gang bonding operation will simultaneously bond all of the fingers in a pattern.

DESCRIPTION OF THE INVENTION

FIG. 3 is a face view of a segment of tape, similar to the FIG. 1 showing, and details the hinge portion in accordance with the invention. The tape segment 20 includes the conventional locater holes 11 in side rail 13, dam bars 12 and fingers 15 extending into the personality window. Each dam bar 12 is traversed by a slot 21 that is shown extending out to a position that is defined at the inner reaches of the locater holes 11. A reduced thickness section 22 extends beyond the slot to the outer reaches of locater holes 11. The reduced thickness sections 22 are made wider than the slots 21 and are etched into the tape from the side that defines the tape finger patterns. As explained above, the tape has a finger pattern side (shown in FIGS. 1 and 3) and a bump side into which the tape bonding bumps are fabricated. This latter side is the one facing away in FIGS. 1 and 3. In the tape fabrication process the pattern etched into the face being viewed in FIGS. 1 and 3 will include slots 12 and reduced thickness areas 22. The bump side of the tape will include etching in the slots 21. Thus, the slots extend completely through the thickness of the tape while regions 22 extend slightly over half way through the tape.

It can be seen that slots 21 mechanically isolate the adjacent finger patterns. As the tape is flexed prior to chip attachment, there will be no distortion of the fingers 15. They will lie in their original plane as the tape is flexed. After a chip is attached to the tape at ILB, the resultant tape stiffening will not greatly reduce flexibility and the tape can easily conform to its transit path on the guide shoe.

Reduced thickness regions 22 enhance the tape flexure in the side rail 13 portions. Since they are etched into the finger pattern side of the tape, they will act to reduce the tape flexure action that would tend to place the metal surface in compression. This permits the tape to be easily flexed as it traverses the tape guide shoe in the ILB machine. Regions 22 still afford substantial tape strength that would resist shearing motion between side rails 13.

As pointed out in connection with FIG. 1, after ILB the tape fingers 15 are excised from the tape at a point which is located just inside the personality window. This is ordinarily done with a punch and die combination that must be maintained in a sharp condition and in a well controlled mating relationship. Since the punch is used repeatedly it will wear and therefore need occasional sharpening to produce a clean separation. One major advantage of the hinge tape is that it is useful as an indicator of when the excise punch needs to be sharpened. To do this the tape scrap exiting from the excision operation is examined. As the punch dulls, the excision operation will result in tearing and deformation of the tape material in the dam bars. The presence of slots 21 result in very thin remaining dam bar portions. If the excision operation is clean the dam bar remains will be undistorted. However, if the excision punch is not sharp enough, the dam bar remains will become distorted.

While FIG. 3 shows a preferred embodiment of the invention other forms of construction can be employed. For example, regions 22 can be made to have the same width as slots 21. Also, regions 22 can be etched completely through the tape rather than part way through. Slots 21 can be terminated where they just span the finger patterns rather than being extended as shown to the inner edges of holes 11. The important aspects are to provide adjacent finger pattern mechanical isolation when the tape is flexed while maintaining adequate resistance to side rail shearing motion.

FIG. 4 shows an alternative form of the invention. Here dam bars 12 are traversed by a series of slots 31. These slots act in the aggregate to form the equivalent of transverse slots in the dam bars. Thus, slots 31 are the equivalent of slots 21 of FIG. 3.

The invention has been described so that a person of ordinary skill in the art can practice it without resorting to any further invention. When such a person reads the foregoing description, alternatives and equivalents, within the spirit and intent of the invention, will be apparent. Accordingly, it is intended that the scope of the invention be limited only by the following claims.

We claim:

1. A process for producing an assembly tape that is to be used for tape assembly bonding of metal fingers to an electronic device comprising the steps:

etching said tape to create a succession of metal finger patterns wherein each pattern includes inwardly extending portions that terminate in an array that mates with the bonding pad pattern associated with said electronic device; and etching said tape in the regions between adjacent metal finger patterns to increase the flexibility of said tape.

2. The process of claim 1 wherein said etching in the regions includes a slot located in the region between said adjacent finger patterns.

3. The process of claim 2 wherein said tape includes locater holes that are used to index and transport said tape in assembly machinery and said slot extends across said tape to span the region between the inner ends of said locater holes.

4. The process of claim 3 wherein said slot further includes slot extension regions in which the metal thickness is reduced, said extension regions being wider than said slot and extending across said tape to span said locater holes.

5. The process of claim 1 wherein said etching in the regions includes a succession of slots extending across the lateral dimension of said tape in the regions between adjacent finger patterns.

* * * * *